United States Patent [19]
Duncan

[11] Patent Number: 5,633,609
[45] Date of Patent: May 27, 1997

[54] CLOCK SYSTEM WITH INTERNAL MONITOR CIRCUITRY FOR SECURE TESTING

[75] Inventor: Richard L. Duncan, Bedford, Tex.

[73] Assignee: National Semiconductor Corporation, Santa Clara, Calif.

[21] Appl. No.: 520,887

[22] Filed: Aug. 30, 1995

[51] Int. Cl.$^6$ .................................................... H03K 5/19
[52] U.S. Cl. ............................ 327/292; 327/20; 327/294
[58] Field of Search ............................... 327/20, 292, 294

[56] References Cited

U.S. PATENT DOCUMENTS 5,406,132  4/1995  Housako ................................. 327/172

*Primary Examiner*—Margaret Rose Wambach
*Attorney, Agent, or Firm*—Limbach & Limbach L.L.P.

[57] ABSTRACT

A clock system includes internal monitor circuitry such that the clock system is testable in a secure environment. In particular, the clock system includes a plurality of separately enableable clock generator circuit modules. Each of the clock generator circuit modules generates a separate clock signal when enabled. Combining circuitry receives the separate clock signals from those clock generator circuit modules which are enabled and derives a derived clock signal therefrom. Monitor circuitry receives the derived clock signal, detects whether there are transitions in the derived clock signal, and provides a monitor indication of a result of the detection. Thus, the clock system can be tested without providing the separate clock signals outside the clock system. Preferably, the clock system also includes a programmable clock control register that holds clock control data, the clock control data determining which of the clock generator circuit modules are enabled. A processor is connected to program the clock control data in the clock control register circuitry. The processor executes a program that programs the clock control data to enable and then disable each of the clock generator circuit modules one at a time and to query the monitor indication while each of the clock generator circuit modules is enabled.

22 Claims, 3 Drawing Sheets

CLOCK SYSTEM WITH INTERNAL MONITOR CIRCUITRY FOR SECURE TESTING

TECHNICAL FIELD OF THE INVENTION

The present invention relates to clock systems, and in particular, to a clock system which includes internal monitor circuitry such that the clock system is testable in a secure environment.

BACKGROUND OF THE INVENTION

Clock generation circuits are employed in many applications, including those involving specialized cryptographic processors. For example, FIG. 1 is a block diagram of a conventional random number generator circuit 100 which includes a clock generation circuit 110. In the random number generator circuit 100, one or more ring oscillators are employed in the clock generation circuit 110 to produce a non-stable output. The output of the clock generation circuit 110 is then combined with the feedback of a linear feedback shift register (LFSR) circuit 120. The non-stable output of the clock generation circuit 110 introduces unknowns into the LFSR 120 output such that the LFSR 120 output has random properties. In particular, the LFSR 120 output may be truly random or may be merely "pseudo"-random. (As used in this specification, including in the claims, the term "random" is meant to encompass both.) The random output of the random number generator circuit 100 is provided to a cryptographic processor 130, via a random number generator register 140. The processor 130 uses the random output to create a unique session key for encrypting data.

Conventionally, to determine if the ring oscillators of the clock generation circuit 110 are operating properly, the ring oscillator output signals are provided to the outside of the random number generator circuit 100 package. However, security is critical in cryptographic applications and an intruder could more accurately predict the output of the random number generator circuit 100 with the information gained from examining the ring oscillator output signals.

SUMMARY OF THE INVENTION

The present invention therefore provides a clock system which includes internal monitor circuitry such that the clock system is testable in a secure environment.

In particular, the clock system includes a plurality of separately enableable clock generator circuit modules. Each of the clock generator circuit modules generates a separate clock signal when enabled. Combining circuitry receives the separate clock signals from those clock generator circuit modules which are enabled and derives a derived clock signal therefrom. Monitor circuitry receives the system clock signal, detects whether there are transitions in the derived clock signal, and provides a monitor indication of a result of the detection. Thus, the clock system can be tested without providing the separate clock signals outside the clock system.

Preferably, the clock system also includes a programmable clock control register that holds clock control data, the clock control data determining which of the clock generator circuit modules are enabled. A processor is connected to program the clock control data in the clock control register circuitry. The processor executes a program that programs the clock control data to enable and then disable each of the clock generator circuit modules one at a time and to query the monitor indication while each of the clock generator circuit modules is enabled.

A better understanding of the features and advantages of the invention will be obtained by reference to the following detailed description and accompanying drawings which set forth an illustrative embodiment in which the principles of the invention are utilized.

DETAILED DESCRIPTION

Figure 1:
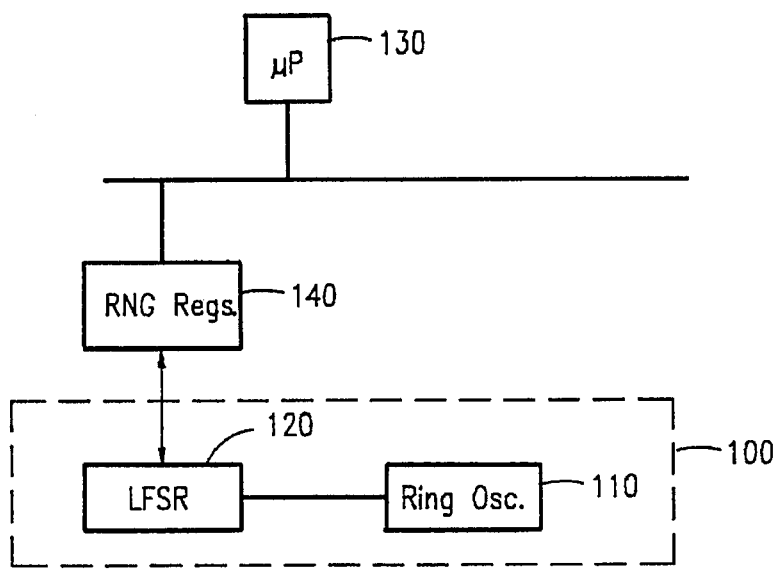
FIG. 1 is a block diagram of a conventional random number generator circuit which includes a clock generation circuit.
Figure 2:
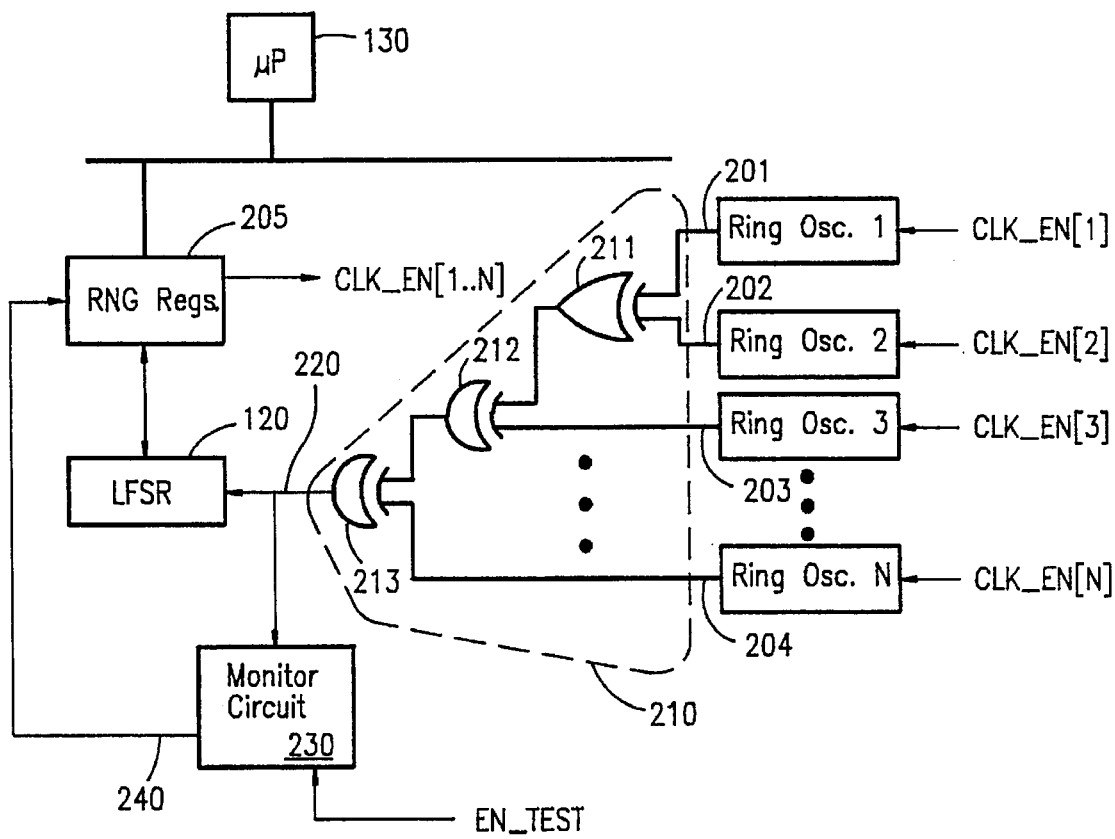
FIG. 2 is a block diagram of a clock system in accordance with one embodiment of the present invention.

Referring now to FIG. 2, ring oscillators 1 through N are separately enableable under the control of the processor 130. In particular, random number generator ("RNG") register module 205 includes a programmable N-bit clock control register CLK_EN. Each bit CLK_EN[i] of the clock control register controls a separate one of the ring oscillators 1 through N. The state of the clock control register is programmable under the control of the processor 130.

Each of ring oscillators 1 through N, when enabled, generates a separate clock signal. For example, referring to FIG. 2, ring oscillator 1 generates clock signal 201; ring oscillator 2 generates clock signal 202; ring oscillator 3 generates clock signal 203; and ring oscillator N generates clock signal 204. The clock signals 201 through 204 are combined by a network 210 of XOR devices 211, 212, and 213 to generate a derived clock signal 220. Besides being provided to the linear feedback shift register (LFSR) 120, the derived clock signal 220 is provided to a monitor circuit 230. The monitor circuit 230 receives the derived clock signal 220 and detects whether there are transitions in the derived clock signal 220. The monitor circuit provides an indication 240 of a result of the detection to the processor 130 via the processor-accessible RNG register module 205.

Figure 3:
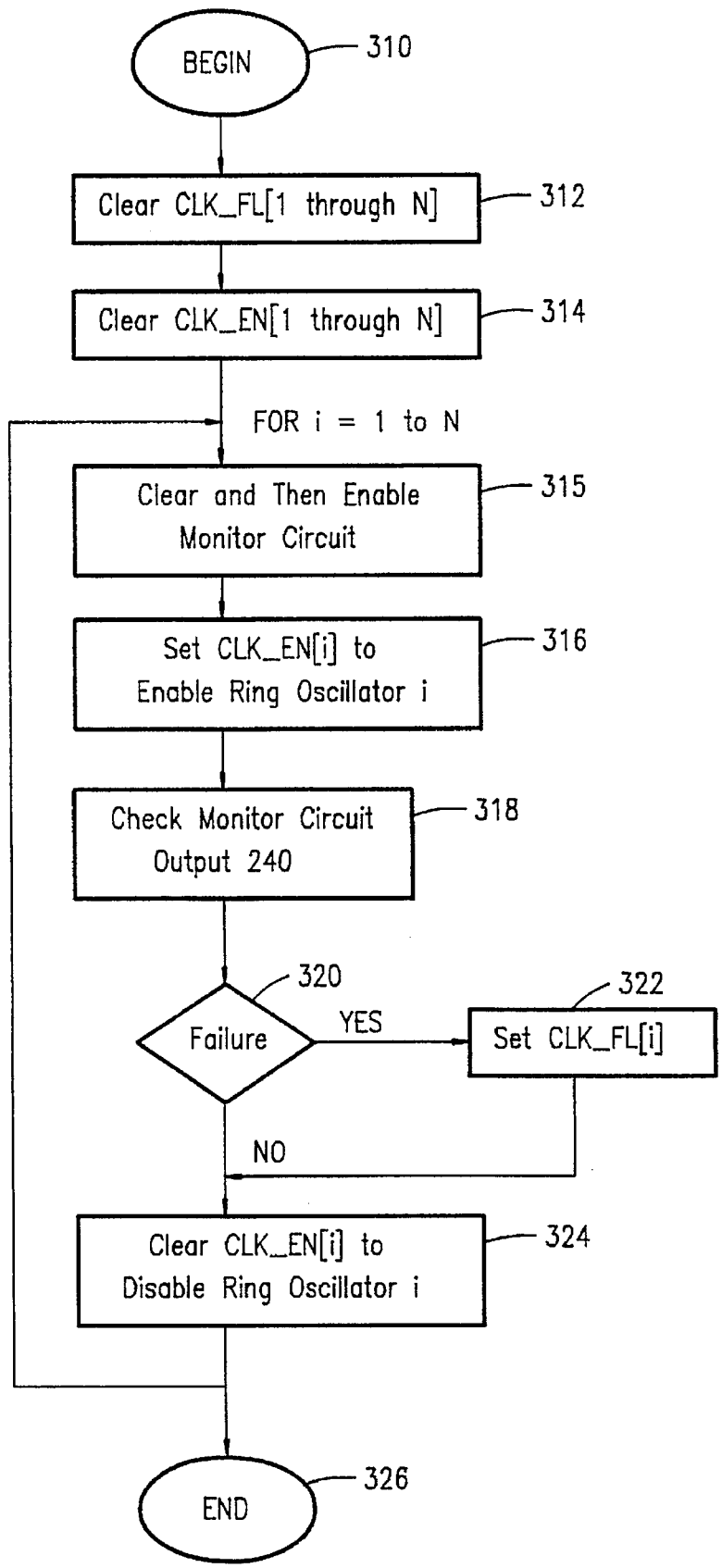
FIG. 3 is a flowchart which illustrates how the clock generation circuit of the clock system of FIG. 2 may be tested.

Preferably, the processor 130 executes a program which separately enables the ring oscillators 1 through N and tallies which, if any, of ring oscillators 1 through N are not operating properly. FIG. 3 is a flowchart of such a program that may be executed by the processor 130. In the flowchart, CLK_FL refers to a variable in a RAM (not shown) which may be modified by the processor 130. Each element of CLK_FL corresponds to a separate one of the ring oscillators 1 through N.

Referring now to FIG. 3, the program begins at step 310. Then, at step 312, all elements 1 through N of CLK_FL are cleared. At step 314, all of ring oscillators 1 through N are disabled by clearing all elements of the CLK_EN register. Steps 315, 316, 318, 320, 322, and 324 constitute a "for" loop which is repeated for i equal 1 through N. At step 315, the monitor circuit 230 is first cleared, by deasserting the EN_TEST signal; and then set, by asserting the EN_TEST signal. At step 316, CLK_EN[i] is set to enable Ring Oscillator i. At step 318, monitor circuit output 240 is checked. As discussed above, the monitor circuit output 240 would normally be provided to the processor 130 via the RNG register module 205. At step 318, it is determined whether the monitor circuit output 240 indicates that ring oscillator i is not working properly. If there is a failure, the processor indicates this by setting CLK_FL[i]. Then, ring oscillator i is disabled. The "for" loop is repeated for each ring oscillator, and the program ends at step 326.

Figure 4:
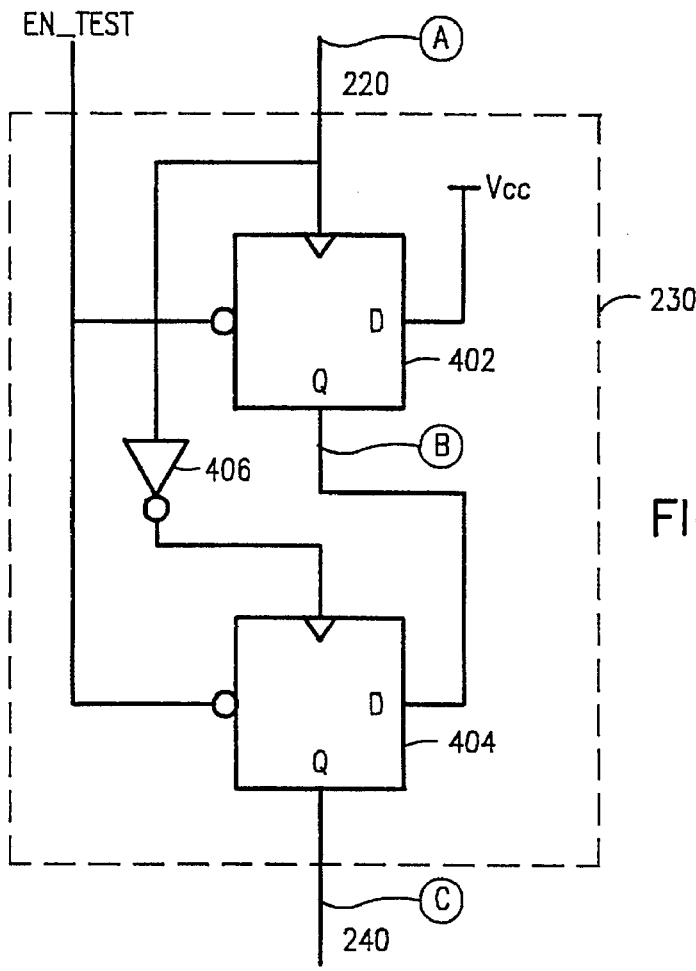
FIG. 4 is a block diagram of one embodiment of the monitor circuitry of the clock system of FIG. 2.

FIG. 4 shows schematically how the monitor circuit 230 may be constituted. The circled "A", "B", and "C" are provided so that signals at these points in the monitor circuit 230 may be easily referenced in the timing diagram of FIG. 5. An EN_TEST signal is provided to each of D-type flip flop 402 and D-type flip flop 404. The D-type flip flops 402, 404 always present a low level output at their respective Q outputs when the EN_TEST signal is not asserted. Thus, the EN_TEST signal should be asserted before testing each ring oscillator. After testing each ring oscillator, the EN_TEST signal should be deasserted to clear the monitor circuit output 240.

Figure 5:
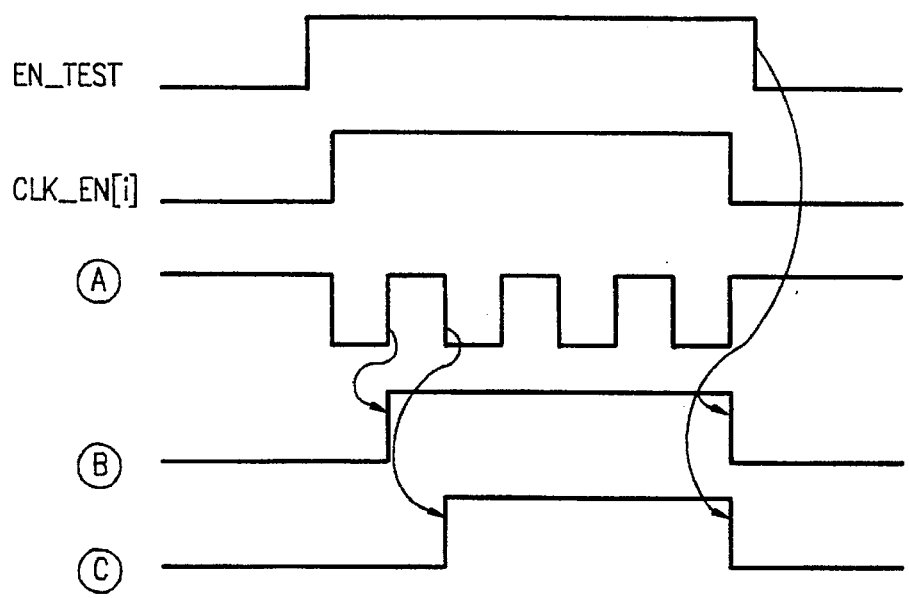
FIG. 5 is a timing diagram which illustrates the operation of the clock generation circuit of the clock system of FIG. 2.

The operation of the FIG. 4 monitor circuit 230 for testing a ring oscillator "i" is now explained with reference to the timing diagram in FIG. 5. First, the EN_TEST signal is asserted. Shortly thereafter, the CLK_EN [i] signal is asserted. At this point, the derived clock signal 220 (if ring oscillator [i] is properly operating), denoted by the circled "A" in FIGS. 4 and 5, begins to transition from a high level to a low level. At the first low-high transition of the derived clock signal 220, the Q output of D-type flip flop 402, denoted by the circled "B" in FIGS. 4 and 5, is asserted. Specifically, the D input of the D-type flip flop 402 is tied to the $V_{CC}$ power supply rail, and this high level is carried through to the Q output of the D-type flip flop 402.

The Q output of the D-type flip flop 402 is connected to the D input of the D-type flip flop 404 and the derived clock signal, inverted by inverter 406, is connected to the clock input of the D-type flip flop 404. Thus, at the next high-low transition of the derived clock signal 220, the high level signal at the Q output of the D-type flip flop 402 is carried through to the Q output of the D-type flip flop 404 (denoted by the circled "C" in FIGS. 4 and 5). This signal is provided from the monitor circuit 230 as the indication 240 of the result of the detection. Finally, when the EN_TEST signal is deasserted, the Q output of D-type flip flop 402 (circled "B" signal) and the Q output of the D-type flip flop 404 (circled "C" signal) are deasserted in response thereto.

Having now described one embodiment in accordance with the present invention, it should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A clock system that is testable in a secure environment, the system comprising:

a plurality of separately enableable clock generator circuit modules, each of said clock generator circuit modules generating a separate clock signal when enabled;

combining circuitry that receives the separate clock signals from those clock generator circuit modules which are enabled and derives a derived clock signal therefrom; and monitor circuitry that receives said derived clock signal, detects whether there are transitions in said derived clock signal, and provides a monitor indication signal that indicates a result of the detection; and enabling and disabling means for selectively enabling separate combinations of at least one of said clock generator circuit modules and for sampling said monitor indication signal while each of said separate combinations of clock generator circuit modules is enabled, wherein said clock system can be tested without providing the separate clock signals outside the clock system.

2. The clock system of claim 1, the enabling and disabling means including a programmable clock control register circuit that holds clock control data, the clock control data held being responsive to the enabling and disabling means and defining which of said clock generator circuit modules are enabled.

3. The clock system of claim 1, wherein the enabling and disabling means includes a processor.

4. The clock system of claim 3, wherein said processor includes means for executing a program that enables and then disables each of said clock generator circuit modules one at a time and samples said monitor indication signal while each of said clock generator circuit modules is enabled.

5. The clock system of claim 1, wherein each separate combination of at least one of said clock generator circuit modules enabled by said enabling and disabling means consists of only one of said clock generator circuit modules.

6. The clock system of claim 5, and further comprising a programmable clock control register circuit that holds clock control data, the clock control data held being responsive to the enabling and disabling means and defining which of said clock generator circuit modules are enabled.

7. The clock system of claim 6, wherein the enabling and disabling means includes a processor.

8. A clock system that is testable in a secure environment, the system comprising:

a plurality of separately enableable clock generator circuit modules, each of said clock generator circuit modules generating a separate clock signal when enabled;

combining circuitry that receives the separate clock signals from those clock generator circuit modules which are enabled and derives a derived clock signal therefrom;

monitor circuitry that receives said derived clock signal, detects whether there are transitions in said derived clock signal, and provides a monitor indication signal that indicates a result of the detection;

wherein said clock system can be tested without providing the separate clock signals outside the clock system, and further comprising:

a programmable clock control register circuit that holds clock control data, the clock control data determining which of said clock generator circuit modules are enabled; and a processor connected to program said clock control data in said clock control register circuitry, said processor executing a program that programs said clock control data to enable and then disable each of said clock generator circuit modules one at a time and to sample said monitor indication signal while each of said clock generator circuit modules is enabled.

9. The clock system of claim 8, and further comprising monitor latch circuitry which latches said monitor indication.

10. The clock system of claim 8, and further comprising monitor indication accumulation circuitry that accumulates said sampled monitored indication signals.

11. A clock system that is testable in a secure environment, the system comprising:

a plurality of separately enableable clock generator circuit modules, each of said clock generator circuit modules generating a separate clock signal when enabled;

combining circuitry that receives the separate clock signals from those clock generator circuit modules which are enabled and derives a derived clock signal therefrom; and monitor circuitry that receives said derived clock signal, detects whether there are transitions in said derived clock signal, and provides a monitor indication signal that indicates a result of the detection;

wherein said clock system can be tested without providing the separate clock signals outside the clock system, and wherein said monitor circuitry comprises:

a D-type flip flop having a clock input, a D input, and a Q output, the clock input being connected to receive the derived clock signal, the D input being connected to receive a signal having the second polarity;

wherein the monitor indication signal at the Q output having the second polarity indicates that the derived clock signal has alternated from the first polarity to the second polarity.

12. The clock system of claim 11 wherein the D-type flip flop is a first D-type flip flop and the monitor circuitry further comprising a second D-type flip flop having a clock input, a D input, and a Q output, the clock input of the second D-type flip flop being connected to receive the derived clock signal, inverted, and the D input of the second D-type flip flop being connected to receive the signal at the Q output of the first D-type flip flop, wherein a signal at the Q output of the second D-type flip flop having the second polarity indicates that the derived clock signal has alternated from the first polarity to the second polarity and back to the first polarity.

13. The clock system of claim 12, and further including enabling and disabling means for enabling and then disabling each of said clock generator circuit modules one at a time and for sampling said monitor indication signal while each of said clock generator circuit modules is enabled.

14. The clock system of claim 11, and further including enabling and disabling means for enabling and then disabling each of said clock generator circuit modules one at a time and for sampling said monitor indication signal while each of said clock generator circuit modules is enabled.

15. A clock system that is testable in a secure environment, the system comprising:

a plurality of separately enableable clock generator circuit modules, each of said clock generator circuit modules generating a separate clock signal when enabled;

combining circuitry that receives the separate clock signals from those clock generator circuit modules which are enabled and derives a derived clock signal therefrom;

monitor circuitry that receives said derived clock signal, detects whether there are transitions in said derived clock signal, and provides a monitor indication signal that indicates a result of the detection;

a programmable clock control register circuit that holds clock control data, the clock control data determining which of said clock generator circuit modules are enabled; and a processor connected to program said clock control data in said clock control register circuitry, said processor executing a program that programs said clock control data to enable and then disable each of said clock generator circuit modules one at a time and to sample said monitor indication signal while each of said clock generator circuit modules is separately enabled.

16. The clock system of claim 15, wherein said monitor circuitry comprises:

a first D-type flip flop having a clock input, a D input, and a Q output, the clock input of the first D-type flip flop being connected to receive the derived clock signal, the D input being connected to receive a signal having a second polarity; and a second D-type flip flop having a clock input, a D input, and a Q output, the clock input of the second D-type flip flop being connected to receive the derived clock signal, inverted, and the D input of the second D-type flip flop being connected to receive the signal at the Q output of the first D-type flip flop, wherein a signal at the Q output of the second D-type flip flop having the second polarity indicates that the derived clock signal has alternated from a first polarity to the second polarity and back to the first polarity.

17. The clock system of claim 15, and further comprising monitor latch circuitry which latches said monitor indication.

18. The clock system of claim 15, and further comprising monitor indication accumulation circuitry that accumulates said sampled monitored indication signals.

19. The clock system of claim 15, wherein said monitor circuitry comprises:

a D-type flip flop having a clock input, a D input, and a Q output, the clock input being connected to receive the derived clock signal, the D input being connected to receive a signal having a second polarity;

wherein the monitor indication signal at the Q output having the second polarity indicates that the derived clock signal has alternated from a first polarity to the second polarity.

20. The clock system of claim 19, and further comprising:

means for separately enabling the separately enableable clock generator circuit modules one at a time such that said derived clock signal is constituted solely by the output of whichever of said clock generator circuit modules is enabled.

21. A clock system that is testable in a secure environment, the system comprising:

a plurality of separately enableable clock generator circuit modules, each of said clock generator circuit modules generating a separate clock signal when enabled;

combining circuitry that receives the separate clock signals from those clock generator circuit modules which are enabled and derives a derived clock signal therefrom; and monitor circuitry that receives said derived clock signal, detects whether there are transitions in said derived clock signal, and provides a monitor indication signal that indicates a result of the detection;

wherein
said clock system can be tested without providing the separate clock signals outside the clock system;
said monitor circuitry comprises a D-type flip flop having a clock input, a D input, and a Q output, the clock input being connected to receive the derived clock signal, the D input being connected to receive a signal having a second polarity; and wherein the monitor indication signal at the Q output having the second polarity indicates that the derived clock signal has alternated from a first polarity to the second polarity.

22. The clock system of claim 21, wherein the D-type flip flop is a first D-type flip flop, the monitor circuitry further comprising:

a second D-type flip flop having a clock input, a D input, and a Q output, the clock input of the second D-type flip flop being connected to receive the derived clock signal, inverted, and the D input of the second D-type flip flop being connected to receive the signal at the Q output of the first D-type flip flop, wherein a signal at the Q output of the second D-type flip flop having the second polarity indicates that the derived clock signal has alternated from the first polarity to the second polarity and back to the first polarity.

* * * * *